US012687784B2

(12) United States Patent (10) Patent No.: US 12,687,784 B2
Choi et al. (45) Date of Patent: Jul. 21, 2026

(54) IRRADIATING MODULE, AND APPARATUS FOR TREATING SUBSTRATE WITH THE SAME

(71) Applicant: SEMES CO., LTD., Cheonan-si (KR)

(72) Inventors: Ki Hoon Choi, Cheonan-si (KR); Hyo Won Yang, Seoul (KR); Hyun Yoon, Hwaseong-si (KR); Tae Hee Kim, Yongin-si (KR); Won Sik Son, Yongin-si (KR); In Ki Jung, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 896 days.

(21) Appl. No.: 17/988,811

(22) Filed: Nov. 17, 2022

(65) Prior Publication Data

US 2023/0152706 A1     May 18, 2023

(30) Foreign Application Priority Data

Nov. 18, 2021     (KR) ........................ 10-2021-0159185

(51) Int. Cl.
G03F 7/00 (2006.01)
B23K 26/03 (2006.01)
H10P 72/00 (2026.01)
H10P 72/50 (2026.01)

(52) U.S. Cl.
CPC ...... G03F 7/70025 (2013.01); H10P 72/0404 (2026.01); H10P 72/0436 (2026.01)

(58) Field of Classification Search
None
See application file for complete search history.

(56) References Cited

U.S. PATENT DOCUMENTS

| | | | |
|---|---|---|---|
| 10,226,853 B2 * | 3/2019 | Bajaj | ...................... B24B 53/017 |
| 2014/0206263 A1 | 7/2014 | Bajaj et al. | |
| 2021/0118701 A1 * | 4/2021 | Chung | .............. H01L 21/30604 |

(Continued)

FOREIGN PATENT DOCUMENTS

| | | |
|---|---|---|
| CN | 105074881 | 11/2015 |
| JP | 2000-331914 | 11/2000 |

(Continued)

OTHER PUBLICATIONS

Office Action from the Korean Intellectual Property Office dated Apr. 12, 2024.

*Primary Examiner* — Sylvia MacArthur

(57) ABSTRACT

The inventive concept provides a substrate treating apparatus. The substrate treating apparatus includes a support unit configured to support and rotate a substrate at a treating space; a liquid supply unit configured to supply a liquid to the substrate supported at the support unit; a housing having an installation space; a laser unit configured to include a laser irradiation unit positioned in the installation space which irradiates a laser light, and an irradiation end having an end positioned to protrude from the housing and which irradiates the laser light irradiated from the laser irradiation unit to a substrate supported on the support unit; and a cover having an inner space and positioned so an end of the irradiation end protruding from the housing is positioned in the inner space, and wherein an opening is formed at a bottom end of the cover to overlap the laser light irradiated from the irradiation end when seen from above.

20 Claims, 11 Drawing Sheets

(56)                 References Cited

U.S. PATENT DOCUMENTS

| | | | |
|---|---|---|---|
| 2022/0068698 A1* | 3/2022 | Jeong | H01L 21/67051 |
| 2023/0152706 A1* | 5/2023 | Choi | H01L 21/67051 |
| | | | 355/67 |
| 2023/0205100 A1* | 6/2023 | Son | H01L 21/6708 |
| | | | 355/30 |

FOREIGN PATENT DOCUMENTS

| | | | | | |
|---|---|---|---|---|---|
| JP | 2004-014726 | | 1/2004 | | |
| JP | 2005-183624 | | 7/2005 | | |
| JP | 2012179642 | | 9/2012 | | |
| JP | 2012179642 A | * | 9/2012 | | B23K 26/70 |
| KR | 10-2002-0060677 | | 7/2002 | | |
| KR | 10-2004-0050863 | | 6/2004 | | |
| KR | 10-2009-0068824 | | 6/2009 | | |
| KR | 10-2011-0066846 | | 6/2011 | | |
| KR | 20110066846 A | * | 6/2011 | | B23K 26/064 |
| KR | 10-2015-0107864 | | 9/2015 | | |
| KR | 10-2018-0046034 | | 5/2018 | | |
| KR | 20180046034 A | * | 5/2018 | | H01L 21/02282 |

* cited by examiner

IRRADIATING MODULE, AND APPARATUS FOR TREATING SUBSTRATE WITH THE SAME

CROSS-REFERENCE TO RELATED APPLICATIONS

A claim for priority under 35 U.S.C. § 119 is made to Korean Patent Application No. 10-2021-0159185 filed on Nov. 18, 2021, in the Korean Intellectual Property Office, the entire contents of which are hereby incorporated by reference.

BACKGROUND

Embodiments of the inventive concept described herein relate to an irradiating module and a substrate treating apparatus with the same, more specifically, a substrate treating apparatus having an irradiating module for irradiating a light to a substrate.

A photolithography process for forming a pattern on the wafer includes an exposing process. The exposing process is an operation which is previously performed for cutting a semiconductor integrated material attached to the wafer into a desired pattern. The exposing process may have various purposes such as forming a pattern for an etching and forming a pattern for the ion implantation. In the exposing process, the pattern is drawn in on the wafer with a light using a mask, which is a kind of 'frame'. When the light is exposed to the semiconductor integrated material on the wafer, for example, a resist on the wafer, chemical properties of the resist change according to a pattern by the light and the mask. When a developing liquid is supplied to a resist which chemical properties have changed according to the pattern, the pattern is formed on the wafer.

In order to precisely perform the exposing process, the pattern formed on the mask must be precisely manufactured. It must be confirmed whether the pattern is formed satisfactory to the process conditions. A large number of patterns are formed on one mask. That is, it takes a lot of time to inspect all of the large number of patterns to inspect one mask. Accordingly, a monitoring pattern capable of representing one pattern group including a plurality of patterns is formed on the mask. In addition, an anchor pattern that may represent a plurality of pattern groups are formed on the mask. The operator may estimate whether patterns formed on the mask are good or not through an inspecting of a monitoring pattern. In addition, the operator may estimate whether patterns formed are the mask are good or not through an inspecting of the anchor pattern.

Also, in order to increase an accuracy of the mask inspection, it is desirable that critical dimension of the monitoring pattern and the anchor pattern are the same. Accordingly, a critical dimension correction process for precisely correcting the critical dimension of patterns formed on the mask is additionally performed.

FIG. 1 illustrates a normal distribution regarding a first critical dimension CDP1 of the monitoring pattern of the mask and a second critical dimension CDP2 (a critical dimension of the anchor pattern) before a critical dimension correction process is performed during a mask manufacturing process. In addition, the first critical dimension CDP1 and the second critical dimension CDP2 have a size smaller than a target critical dimension. Before the critical dimension correction process is performed, there is a deliberate deviation between the critical dimension of the monitoring pattern and the anchor pattern (CD, critical dimension). And, by additionally etching the anchor pattern in the critical dimension correction process, the critical dimension of these two patterns are made the same. In the process of over-etching the anchor pattern, if the anchor pattern is more over-etched than the monitoring pattern, a difference in the critical dimension of the monitoring pattern and the anchor pattern occurs, and thus the critical dimension of the patterns formed at the mask may not be accurately corrected. When additionally etching the anchor pattern, a precise etching with respect to the anchor pattern should be accompanied.

In order for the anchor pattern to be accurately etched, an angle and output of light irradiated to the anchor pattern must be precisely adjusted. If particles or droplets of a treating liquid are attached to an irradiator in which a light is irradiated to the anchor pattern, an angle of light irradiated to the anchor pattern is distorted and the irradiation path of light is changed. Accordingly, a profile of the light irradiated to the anchor pattern may be changed. For this reason, a precise etching of the anchor pattern may not be performed. In addition, particles or droplets attached to the irradiator cause a corrosion of the irradiator and act as a factor which reduces a durability of the irradiator.

SUMMARY

Embodiments of the inventive concept provide an irradiating module and a substrate treating apparatus with the same for efficiently treating a substrate.

Embodiments of the inventive concept provide an irradiating module and a substrate treating apparatus with the same for performing a precise etching on a substrate.

Embodiments of the inventive concept provide an irradiating module and a substrate treating apparatus which with the same with a high durability for minimizing particles generated during a process and an influence of an ink drop.

The technical objectives of the inventive concept are not limited to the above-mentioned ones, and the other unmentioned technical objects will become apparent to those skilled in the art from the following description.

A substrate treating apparatus includes a support unit supporting and rotating a substrate at a treating space, a liquid supply unit supplying a liquid to the substrate supported by the support unit, a housing having an installation space, a laser unit including a laser in the installation space which emits a laser light in a first direction, a reflector directing the laser light in a second direction, and an irradiation end extending in the second direction through a bottom surface of the housing and emitting the laser light toward the substrate supported by the support unit, and a cover having an inner space into which the irradiation end protrudes from the housing. The cover includes an opening at a bottom of the cover and the laser light emitted from the irradiation end passes through the opening of the cover.

According to an embodiment of the present disclosure, an irradiating module for irradiating a light to a substrate includes: a housing having an installation space; a laser unit configured to include a laser irradiation unit positioned in the installation space which irradiates a laser light, and an irradiation end having an end positioned to protrude from the housing and which irradiates the laser light irradiated from the laser irradiation unit to the substrate; and a cover having an inner space and positioned so an end of the irradiation end protruding from the housing is positioned in the inner space, and wherein an opening is formed at a bottom end of the cover to overlap the laser light irradiated from the irradiation end when seen from above.

In an embodiment, the irradiating module further includes a purge gas supply unit for supplying a purge gas to the inner space.

In an embodiment, a dividing member in a ring shape is installed at the inner space of the cover to divide the inner space into a buffer space which is above and a bottom space.

In an embodiment, the dividing member includes: a first slit formed at a region which is adjacent to a part at which the purge gas is supplied to in the inner space among the inner space, and which has a first opening area; and a second slit formed at a region facing the part at which the purge gas is supplied to in the inner space among the inner space, and which has a second opening area, and wherein the first opening area is smaller than the second opening area.

In an embodiment, a purge port is formed and connected to the purge gas supply unit at an end of the housing, and a supply port is installed at a side of the cover which is spaced apart from a central axis of the irradiation end when seen from the front, and which supplies the purge gas to the inner space, and the irradiation module further comprises a flow cover combined to the side of the cover to connect the purge port and the supply port, which has a flow space for flowing the purge gas within.

In an embodiment, the irradiating module further includes a cover plate provided to cover the opening and which is provided as a material which passes the laser light through.

According to an embodiment of the present disclosure, a substrate treating apparatus is provided for treating a mask having a plurality of cells. The substrate treating apparatus includes a support unit configured to support and rotate the mask on which a first pattern is formed within the plurality of cells and a second pattern is formed outside a region at which the cells are formed; a liquid supply unit configured to supply a liquid to the mask supported at the support unit; a housing having an installation space; a laser unit configured to include a laser irradiation unit positioned in the installation space which irradiates a laser light, and an irradiation end having an end positioned to protrude from the housing and which irradiates the laser light irradiated from the laser irradiation unit to the second pattern among the first pattern and the second pattern; and a cover having an inner space and positioned so an end of the irradiation end protruding from the housing is positioned in the inner space, and wherein an opening is formed to overlap a laser light irradiated from the irradiation end when seen from the above.

In an embodiment, the substrate treating apparatus further includes a purge gas supply unit for supplying a purge gas to the inner space.

In an embodiment, a dividing member in a ring shape is installed at the inner space of the cover to divide the inner space into a buffer space which is above and a bottom space, and the dividing member includes: a first slit formed at a region which is adjacent to a part at which the purge gas is supplied to in the inner space among the inner space, and which has a first opening area; and a second slit formed at a region facing the part at which the purge gas is supplied to in the inner space among the inner space, and which has a second opening area, and wherein the first opening area is smaller than the second opening area.

In an embodiment, a purge port is formed and connected to the purge gas supply unit at an end of the housing, and a supply port is installed at a side of the cover which is spaced apart from a central axis of the irradiation end when seen from the front, and which supplies the purge gas to the inner space, and the substrate treating apparatus further comprises a flow cover combined to the side of the cover to connect the purge port and the supply port, which has a flow space for flowing the purge gas within.

According to an embodiment of the present disclosure, a substrate may be efficiently treated.

According to an embodiment of the present disclosure, a precise etching may be performed on a substrate.

According to an embodiment of the present disclosure, an etching of a specific pattern formed on a substrate may be precisely performed.

According to an embodiment of the present disclosure, particles generated during a process or an influence of ink drops are minimized to increase a durability of the irradiating module and a substrate treating apparatus.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
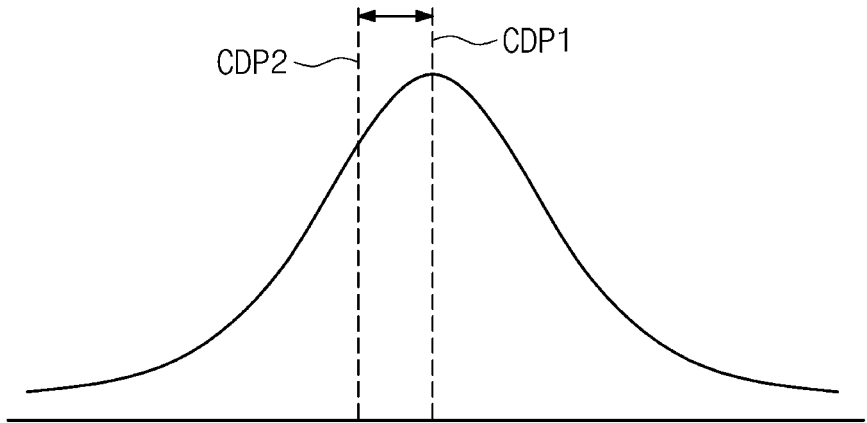
FIG. 1 illustrates a normal distribution of a critical dimension of a monitoring pattern and a critical dimension of an anchor pattern.

The inventive concept may be variously modified and may have various forms, and specific embodiments thereof will be illustrated in the drawings and described in detail.

However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

Hereinafter, embodiments of the present disclosure will be described in detail with reference to the accompanying drawings.

Figure 2:
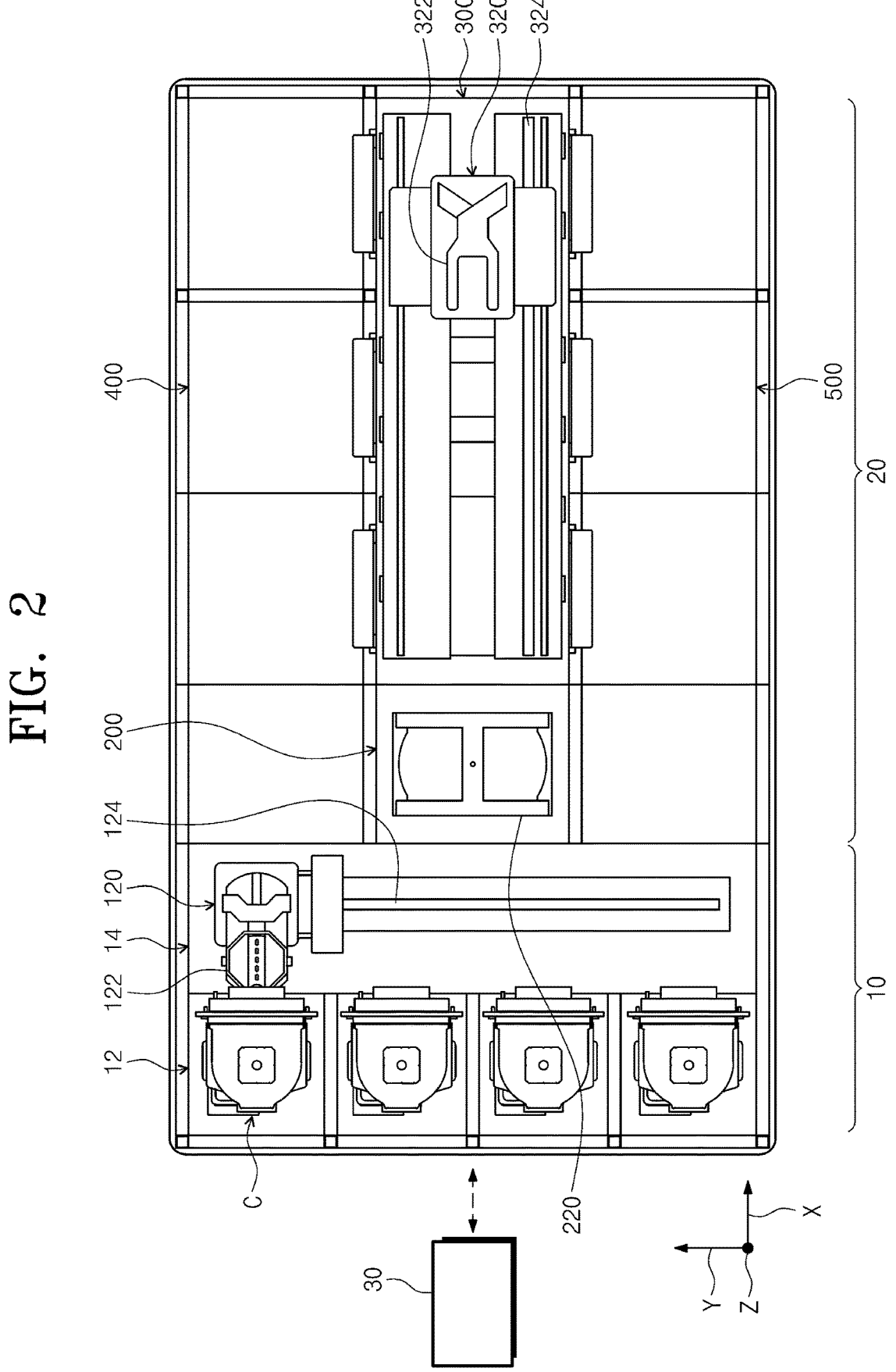
FIG. 2 is a plan view schematically illustrating a substrate treating apparatus according to an embodiment of the present disclosure.

Hereinafter, an embodiment of the present disclosure will be described in detail with reference to FIG. 2 to FIG. 16. FIG. 2 is a plan view schematically illustrating a substrate treating apparatus according to an embodiment of the present disclosure.

Referring to FIG. 2, the substrate treating apparatus includes an index module 10, a treating module 20, and a controller 30. According to an embodiment, when viewed from the front, the index module 10 and the treating module 20 may be disposed along a direction.

Hereinafter, a direction in which the index module 10 and the treating module 20 are disposed is defined as a first direction X, a direction perpendicular to the first direction X when viewed from above is defined as a second direction Y, and a direction perpendicular to a plane including both the first direction X and the second direction Y is defined as a third direction Z.

The index module 10 transfers a substrate M from a container C in which the substrate M is accommodated to the treating module 20 for treating the substrate M. The index module 10 stores a substrate M on which a predetermined treatment has been completed at the treating module 20 in the container C. A lengthwise direction of the index module 10 may be formed in the second direction Y. The index module 10 may have a load port 12 and an index frame 14.

The container C in which the substrate M is accommodated is seated on the load port 12. The load port 12 may be positioned on an opposite side of the treating module 20 with respect to the index frame 14. A plurality of load ports 12 may be provided, and the plurality of load ports 12 may be arranged in a line along the second direction Y. The number of load ports 12 may increase or decrease according to a process efficiency and foot print conditions, etc. of the treating module 20.

As the container C, a sealing container such as a front opening unified pod (FOUP) may be used. The container C may be placed on the load port 12 by a transfer means (not shown) such as an overhead transfer, an overhead conveyor, or an automatic guided vehicle, or by an operator.

The index frame 14 provides a transfer space for transferring the substrate W. An index robot 120 and an index rail 124 may be provided at the index frame 14. The index robot 120 transfers the substrate M. The index robot 120 may transfer the substrate M between the index module 10 and the buffer unit 200 to be described later. The index robot 120 includes an index hand 122. The substrate M may be placed on the index hand 122. The index hand 122 may be provided to be forwardly and backwardly movable, rotatable in the third direction Z, and movable along the third direction Z. The index hand 122 may be provided in plural. A plurality of index hands 122 may be provided to be spaced apart from each other in an up/down direction. The plurality of index hands 122 may be forwardly and backwardly movable independently of each other.

The index rail 124 is provided in the index frame 14. The index rail 124 is provided with its lengthwise direction along the second direction Y. The index robot 120 may be placed on the index rail 124, and the index robot 120 may be linearly movable along the index rail 124.

The controller 30 may control a substrate treating apparatus 1. The controller 30 may control a configuration provided to the substrate treating apparatus 1. The controller 30 may comprise a process controller consisting of a microprocessor (computer) that executes a control of the substrate treating apparatus 1, a user interface such as a keyboard via which an operator inputs commands to manage the substrate treating apparatus 1, and a display showing the operation situation of the substrate treating apparatus 1, and a memory unit storing a treating recipe, i.e., a control program to execute treating processes of the substrate treating apparatus 1 by controlling the process controller or a program to execute components of the substrate treating apparatus 1 according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

The treating module 20 may include a buffer unit 200, a transfer frame 300, and a liquid treating chamber 400. The buffer unit 200 provides a space in which a substrate M taken into the treating module 20 and a substrate M taken out of the treating module 20 temporarily remain. The transfer frame 300 provides a space for transferring the substrate M between the buffer unit 200, the liquid treating chamber 400, and the drying chamber 500. The liquid treating chamber 400 supplies a liquid onto the substrate M to perform a liquid treatment process for treating the substrate M. The drying chamber 500 performs a drying process for drying the substrate W on which a liquid treatment has been completed.

The buffer unit 200 may be disposed between the index frame 14 and the transfer frame 300. The buffer unit 200 may be positioned at an end of the transfer frame 300. A slot (not shown) in which the substrate M is placed is provided inside the buffer unit 200. The slot (not shown) may be provided in a plurality. The plurality of slots (not shown) may be provided to be spaced apart from each other in the third direction Z.

A front face and a rear face of the buffer unit 200 are opened. The front face is a surface facing the index module 10, and the rear face is a surface facing the transfer frame 300. The index robot 120 may approach the buffer unit 200 through the front face, and the transfer robot 320 to be described later may approach the buffer unit 200 through the rear face.

The transfer frame 300 may have a lengthwise direction provided in the first direction X. The liquid treating chamber 400 and the drying chamber 500 may be disposed on both sides of the transfer frame 300. The liquid treating chamber 400 and the drying chamber 500 may be disposed at a side of the transfer frame 300. The transfer frame 300 and the liquid treating chamber 400 may be disposed along the second direction Y. The transfer frame 300 and the drying chamber 500 may be disposed along the second direction Y.

According to an embodiment, liquid treating chambers 400 may be disposed on both sides of the transfer frame 300. The liquid treating chambers 400 may be provided in an arrangement of AX B (where A and B are natural numbers greater than 1 or 1 respectively) along the first direction X and the third direction Z respectively at aside of the transfer frame 300.

The transfer frame 300 includes a transfer robot 320 and a transfer rail 324. The transfer robot 320 transfers the substrate M. The transfer robot 320 transfers the substrate M between the buffer unit 200, the liquid treating chamber 400, and the drying chamber 500. The transfer robot 320 includes a transfer hand 322 on which the substrate M is placed. The substrate M may be placed on the transfer hand 322. The transfer hand 322 may be provided to be forwardly and backwardly movable, to be rotatable around the third direction Z, and movable along the third direction Z. The transfer hand 322 may be provided in plural. The plurality of transfer hands 322 are provided to be spaced apart from each other in the up/down direction, and the plurality of transfer hands 322 may be forwardly and backwardly movable independently of each other.

The transfer rail 324 may be provided in the transfer frame 300 along a lengthwise direction of the transfer frame 300. In an embodiment, the lengthwise direction of the transfer rail 324 may be provided along the first direction X. The transfer robot 320 may be placed on the transfer rail 324 and the transfer robot 320 may be movable on the transfer rail 324.

Figure 3:
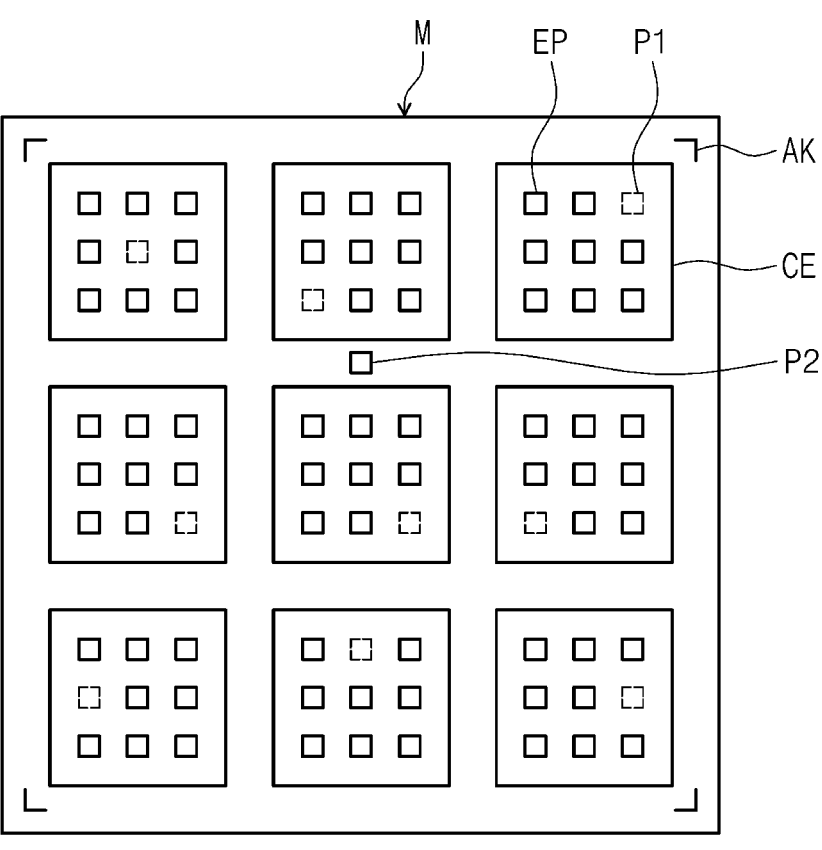
FIG. 3 schematically illustrates a state of a substrate treated at a liquid treating chamber of FIG. 2 seen from above.

FIG. 3 schematically illustrates the substrate treated at the liquid treating chamber of FIG. 2 seen from above. Hereinafter, a substrate M treated in the liquid treating chamber 400 will be described in detail according to an embodiment of the present disclosure referring to FIG. 3.

Referring to FIG. 3, an object to be treated in the liquid treating chamber 400 may be any one of a wafer, a glass, and a photomask. For example, the substrate M treated in the liquid treating chamber 400 according to an embodiment of the present disclosure may be a photo mask, which is a 'frame' used in an exposing process.

The substrate M may have a rectangular form. The substrate M may be a photo mask that is a 'frame' used in the exposing process. At least one reference mark AK may be marked on the substrate M. For example, a plurality of reference marks AK may be formed in each corner region of the substrate M. The reference mark AK may be a mark called an align key used when aligning the substrate M. Also, the reference mark AK may be a mark used to derive a position of the substrate M. For example, an imaging unit 4540 to be described later may acquire an image by imaging the reference mark AK and transmit the acquired image to the controller 30. The controller 30 then may analyze the image including the reference mark AK to detect an accurate position of the substrate M. In addition, the reference mark AK may be used to determine a position of the substrate M when the substrate M is transferred.

A cell CE may be formed on the substrate M. At least one cell CE, for example, a plurality of cells CE may be formed.

A plurality of patterns may be formed at each cell CE. The patterns formed at each cell CE may be defined as one pattern group. Patterns formed at the cell CE may include an exposing pattern EP and a first pattern P1. A second pattern P2 may be proved in a region outside the cell region where the plurality of cells care formed.

The exposing pattern EP may be used to form an actual pattern on the substrate M. The first pattern P1 may be a single-cell representative pattern representing exposing patterns EP in one cell CE. In addition, when the plurality of cells CE are provided, the first pattern is provided in each cell, thereby a plurality of first patterns P1 may be provided. In an embodiment, each of the plurality of cells CE may be provided with single first pattern P1. However, the present disclosure is not limited thereto, and the plurality of first patterns P1 may be formed in one cell CE. The first pattern P1 may have a form in which portions of each exposing pattern EP are combined. The first pattern P1 may be referred to as a monitoring pattern. An average value of critical dimension of the plurality of first patterns P1 may be referred to as a critical dimension monitoring macro (CDMM).

When an operator inspects the first pattern P1 formed at any one cell CE through a scanning electron microscope (SEM), it is possible to estimate whether a form of the exposing patterns EPs formed in one cell CE are good or bad. The first pattern P1 may serve as an inspection pattern to inspect the exposing patters EPs. Also, unlike the above-described example, the first pattern P1 may be any one of the exposing patterns EPs used in an actual exposing process. Selectively, the first pattern P1 may be serve as not only inspection pattern to inspect the exposing patterns but also simultaneously a exposing pattern used in the actual exposing.

The second pattern P2 may be an entire-cell representative pattern representing exposing patterns EP on whole cells of the substrate M. For example, the second pattern P2 may have a form in which portions of each of the first patterns P1 are combined.

When the operator inspects the second pattern P2 through the scanning electron microscope (SEM), it is possible to estimate whether a form of the exposing patterns EPs formed on one substrate M are good or bad. Accordingly, the second pattern P2 may serve an inspection pattern. In addition, the second pattern P2 may be an inspection pattern that is not used in an actual exposing process. The second pattern P2 may be a pattern for setting a process condition of an exposing apparatus. The second pattern P2 may be referred to as an anchor pattern.

Hereinafter, the liquid treating chamber 400 according to an embodiment of the present disclosure will be described in detail. Hereinafter, a treating process performed while the liquid treating chamber 400 performs a fine critical dimension correction (FCC) process during a process of manufacturing a mask for an exposing process will be described as an example.

A substrate M to be taken in and treated at the liquid treating chamber 400 may be a substrate M on which a pre-treatment has been performed. A critical dimension of the first pattern P1 and a critical dimension of the second pattern P2 of the substrate M to be taken into the liquid treating chamber 400 may be different from each other. According to an embodiment of the present disclosure, the critical dimension of the first pattern P1 may be greater than the critical dimension of the second pattern P2. In on embodiment, the critical dimension of the first pattern P1 has a first width (e.g., 69 nm). The critical dimension of the second pattern P2 may have a second width (e.g., 68.5 nm).

Figure 4:
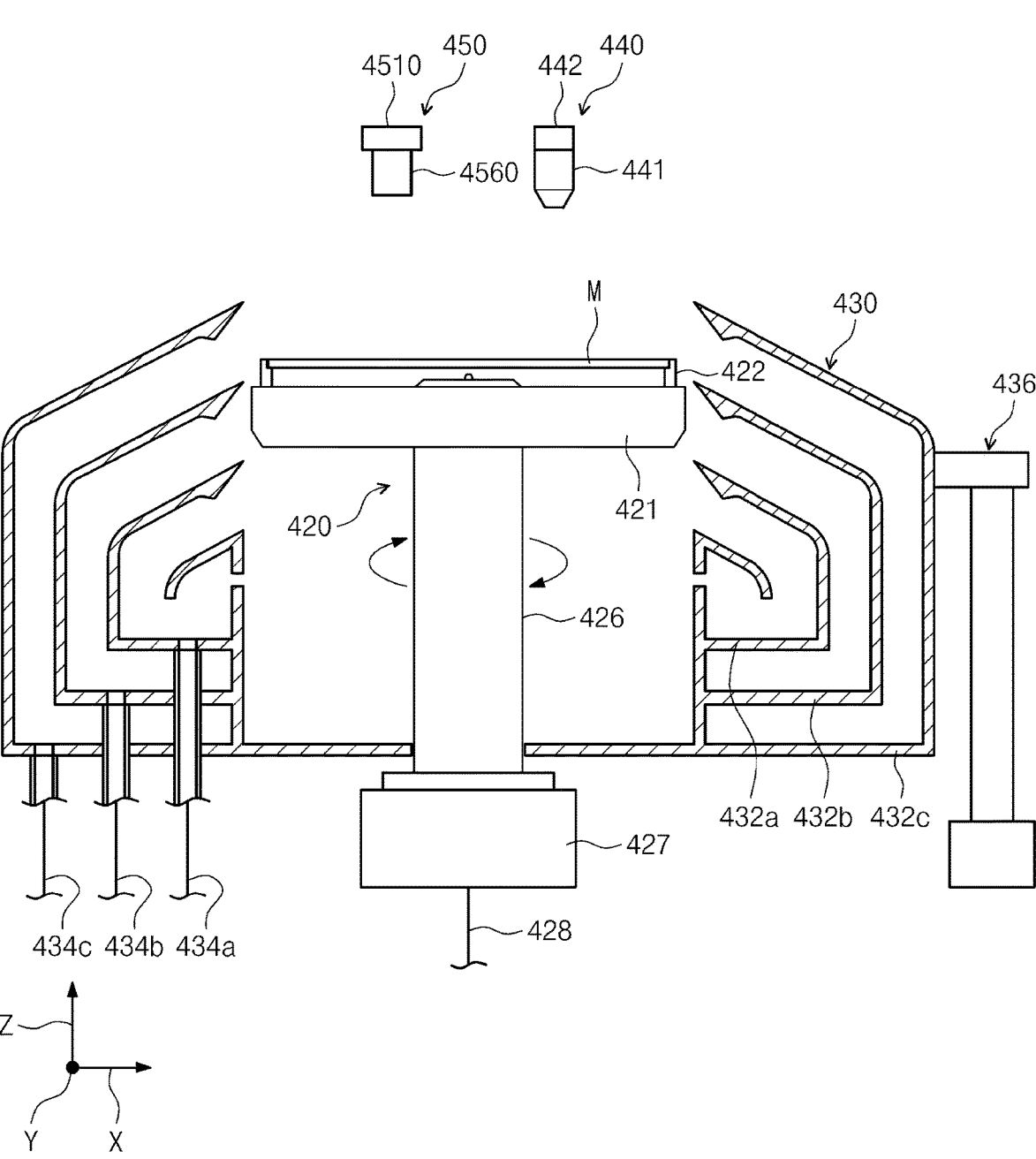
FIG. 4 schematically illustrates an embodiment of the liquid treating chamber of FIG. 2.
Figure 5:
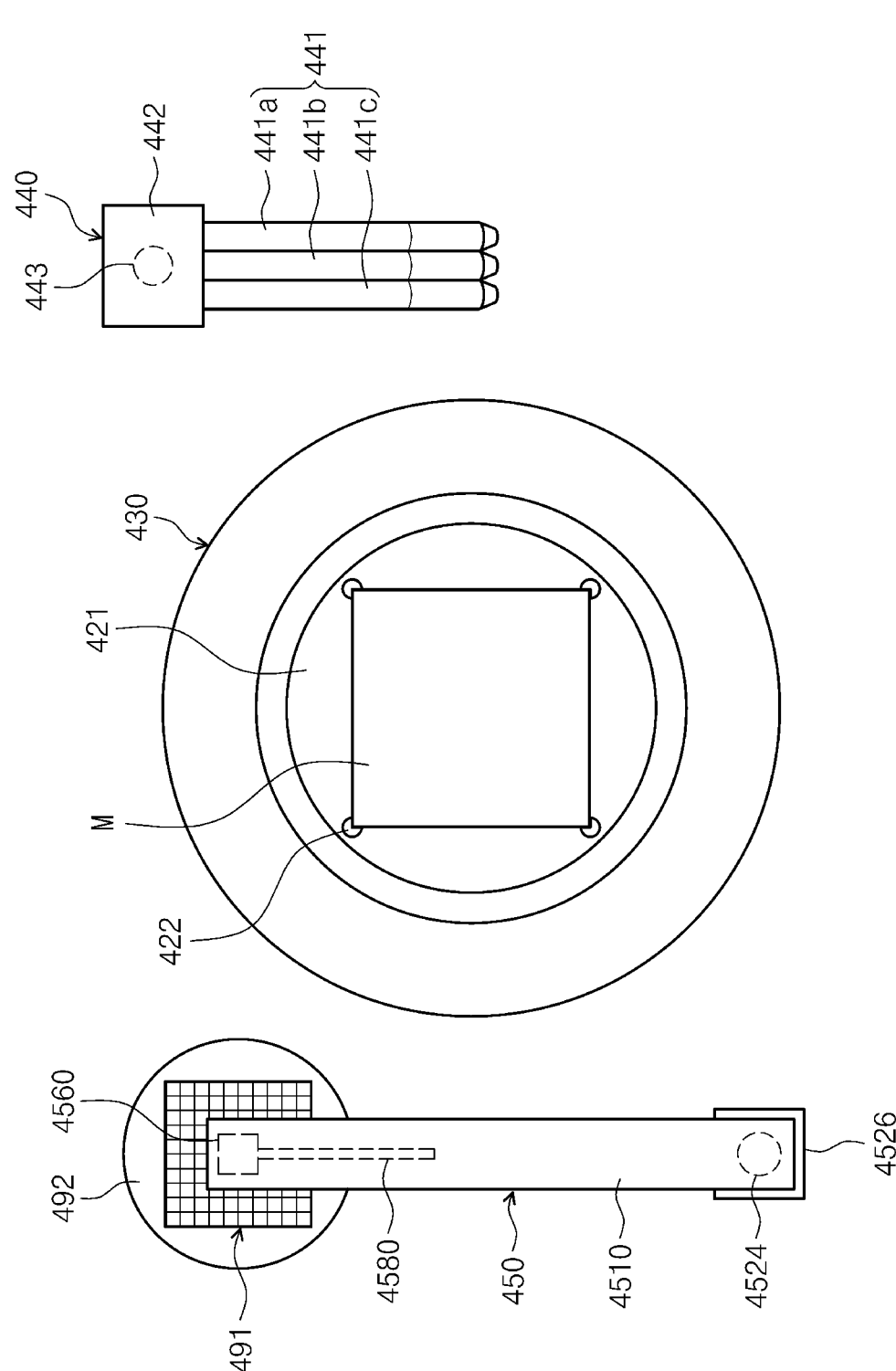
FIG. 5 is a top view of the liquid treating chamber of FIG. 4.

FIG. 4 schematically illustrates an embodiment of the liquid treating chamber of FIG. 2. FIG. 5 is a top view of the liquid treating chamber of FIG. 4. Referring to FIG. 4 and FIG. 5, the liquid treating chamber 400 may include a housing (not shown), a support unit 420, a treating container 430, a liquid supply unit 440, and an irradiating module 450.

The housing 410 has an inner space. The inner space may have a support unit 420, a treating container 430, a liquid supply unit 440, and an irradiating module 450. The housing 410 may have a gateway (not shown) provided through which the substrate M may be taken in and taken out. An inner wall surface of the housing (not shown) may be coated with a material having a high corrosion resistance to a chemical supplied by the liquid supply unit 440.

An exhaust hole (not shown) may be formed on a bottom surface of the housing (not shown). The exhaust hole (not shown) may be connected to an exhaust member such as a pump capable of exhausting an inner space. A fume or the like that may be generated at the inner space may be exhausted to an outside of the housing (not shown) through the exhaust hole (not shown).

The support unit 420 may support the substrate M. The support unit 420 may support the substrate W in a treating space of the treating container 430 to be described later. The support unit 420 may rotate the substrate M. The support unit 420 may include a body 421, a support pin 422, a support shaft 426, and a driving member 427.

The body 421 may have a plate form. The body 421 may have a plate form having a constant thickness. The body 421 may have a top surface provided in a generally circular form when viewed from above. The top surface of the body 421 may be provided to have an area larger than that of the substrate M. The support pin 422 may be installed on the body 421.

The support pin 422 supports the substrate M. When viewed from above, the support pin 422 may have a downwardly stepped portion to support the substrate M. The stepped portion of the support pin 422 may have a first surface and a second surface. For example, the first surface may support a back-side (bottom side) surface at edge region of the substrate M. The second surface may face a side surface of the edge region substrate M. Accordingly, if the substrate M rotates, a lateral movement of the substrate M may be limited.

At least one support pin 422 is provided. In an embodiment, a plurality of support pins 422 may be provided. The support pins 422 may be provided in a number corresponding to the number of corners of the substrate M having a rectangular form. The support pin 422 may support the back-side (bottom surface) of the substrate M to be spaced apart from a top surface of the body 421.

The support shaft 426 is coupled to the body 421. The support shaft 426 is positioned below the body 421. The support shaft 426 may be a hollow shaft. A fluid supply line 428 may be formed inside the hollow shaft. The fluid supply line 428 may supply a treating fluid or/and a treating gas to a bottom portion of the substrate M. For example, the treating fluid may include a chemical or a rinsing liquid. The chemical may be an acid or a liquid having a base property. The rinsing liquid can be a pure water. For example, the treating gas may be an inert gas. The treating gas may dry the bottom portion of the substrate M. However, unlike the above-described example, the fluid supply line 428 may not be provided inside the support shaft 426.

The support shaft 426 may be rotated by the driving member 427. The driving member 427 may be a hollow motor. When the driving member 427 rotates the support shaft 426, the body 421 coupled to the support shaft 426 may rotate. The substrate M may be rotated together with a rotation of the body 421 via the support pin 422.

The treating container 320 has a treating space. The treating container 430 has a treating space at which the substrate M is treated. In an embodiment, the treating container 430 may have a treating space with an open top. The treating container 430 may have a cylindrical form with an open top. The substrate M may be liquid-treated and heat-treated in the treating space. The treating container 430 can prevent the treating liquid supplied to the substrate M from being scattered to the housing 410, the liquid supply unit 440, and the irradiating module 450.

The treating container 430 may have a plurality of recollecting containers 432a, 432b, and 432c. Each of the recollecting containers 432a, 432b, and 432c may separately recollect different liquids from each other among liquids used for treating the substrate M. Each of the recollecting containers 432a, 432b, and 432c may have a recollecting space for recollecting a liquid used for treating the substrate M. Each of the recollecting containers 432a, 432b, and 432c may be provided in an annular ring form surrounding the support unit 420 when seen from above. When the liquid treatment process is performed, a liquid scattered by a rotation of the substrate M is introduced into the recollecting space through an inlet, which is a space formed between the recollecting containers 432a, 432b, and 432c, respectively. The different types of treating liquids may be introduced into each of the recollecting containers 432a, 432b, and 432c.

According to an embodiment, the treating container 430 may have a first recollecting container 432a, a second recollecting container 432b, and a third recollecting container 432c. The first recollecting container 432a may be provided in an annular ring form surrounding the support unit 420. The second recollecting container 432b may be provided in an annular ring form surrounding the first recollecting container 432a. The third recollecting container 432c may be provided in an annular ring form surrounding the second recollecting container 432b.

To each of the recollecting containers 432a, 432b, 432c, recollecting lines 434a, 434b, 434c extending vertically in a bottom direction of a respective bottom surface can be connected. Each of the recollecting lines 434a, 434b, 434c may discharge a treating liquid introduced through each of the recollecting containers 432a, 432b, 432c. A discharged treating liquid may be reused through an outer treating liquid regeneration system (not shown).

The treating container 430 may be coupled to a lifting/lowering member 436. The lifting/lowering member may move the treating container 430. For example, the lifting/lowering member 436 may change a position of the treating container 430 along the third direction Z. The lifting/lowering member 436 may be a driving device for moving the treating container 430 in the up/down direction. The lifting/lowering member 436 may move the treating container 430 in an upward direction while a liquid treatment and/or a heat treatment are performed on the substrate M. The lifting/lowering member 436 may move the treating container 430 in a downward direction when the substrate M is taken into the inner space or the substrate M is taken out of the inner space.

The liquid supply unit 440 may supply a liquid to the substrate M. The liquid supply unit 440 may supply a treating liquid for liquid treating the substrate M. The liquid supply unit 440 may supply the treating liquid to a substrate M supported by the support unit 420. In an embodiment, the liquid supply unit 440 may supply the treating liquid to a substrate M having a first pattern formed within a plurality of cells CE and a second pattern P2 formed outside a region at which the cells CE are formed.

The treating liquid may be an etching liquid or a rinsing liquid. The etching liquid may be a chemical. The etching liquid may etch a pattern formed on the substrate M. The etching liquid may also be referred to as an etching liquid. The etching liquid may be a liquid containing a mixed solution in which an ammonia, a water, and additives are mixed and a hydrogen peroxide is included. The rinsing liquid may clean the substrate M. The rinsing liquid may be provided as a known chemical liquid.

Referring to FIG. 5, the liquid supply unit 440 may include a nozzle 441, a fixing body 442, a rotation shaft 443, and a rotation member 444. The nozzle 441 may supply the treating liquid to the substrate M supported by the support unit 420. An end of the nozzle 441 may be connected to an end of the fixing body 442, and another end thereof may extend in a direction from the fixing body 442 toward the substrate M. The nozzle 411 may extend from the fixing body 442 in the first direction X.

The nozzle 411 may include a first nozzle 411a, a second nozzle 411b, and a third nozzle 411c. Any one of the first nozzle 411a, the second nozzle 411b, or the third nozzle 411c may supply a chemical among the above-described treating liquids. In addition, another one of the first nozzle 411a, the second nozzle 411b, and the third nozzle 411c may supply the rinsing liquid R among the aforementioned treating liquids. The last one of the first nozzle 411a, the second nozzle 411b, or the third nozzle 411c may supply a different kind of chemical which is different from a chemical supplied by the another one of the first nozzle 411a, the second nozzle 411b, or the third nozzle 411c.

A body 442 may fix and support the nozzle 441. The body 442 may be connected to the rotation shaft 443 rotated in the third direction Z by the rotation member 444. When the rotation member 444 rotates the rotation shaft 443, the body 442 may rotate around the third direction Z. Accordingly, an outlet of the nozzle 441 may move between a liquid supply position which is a position where the treating liquid is supplied to the substrate M and a standby position which is a position where the treating liquid is not supplied to the substrate M.

Figure 6:
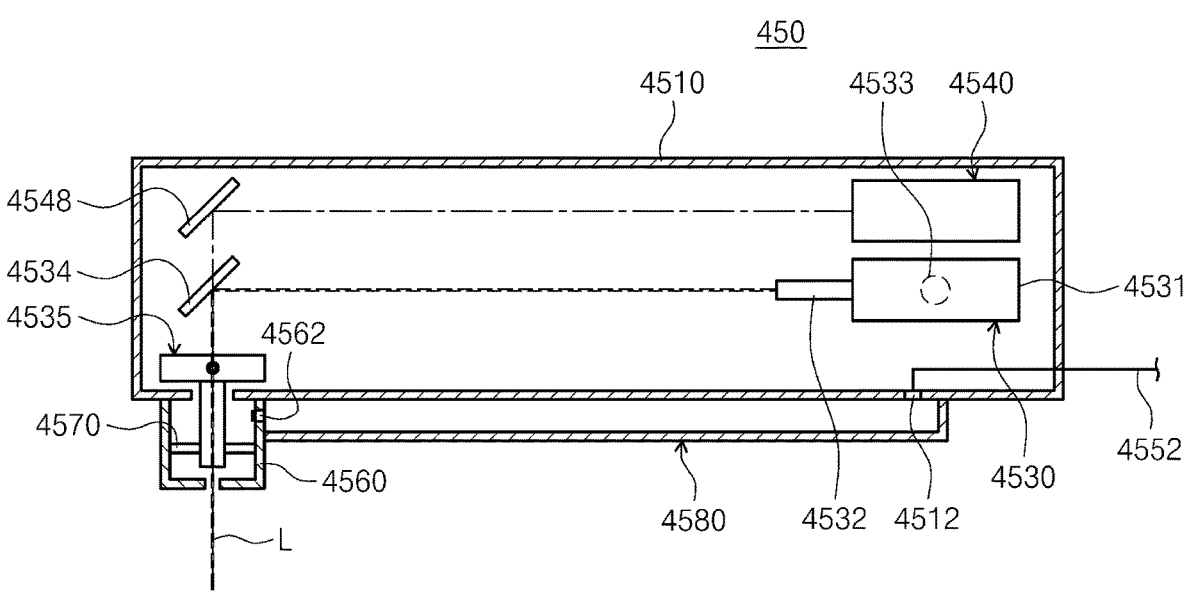
FIG. 6 schematically illustrates an irradiating module of FIG. 4 viewed from the front.
Figure 7:
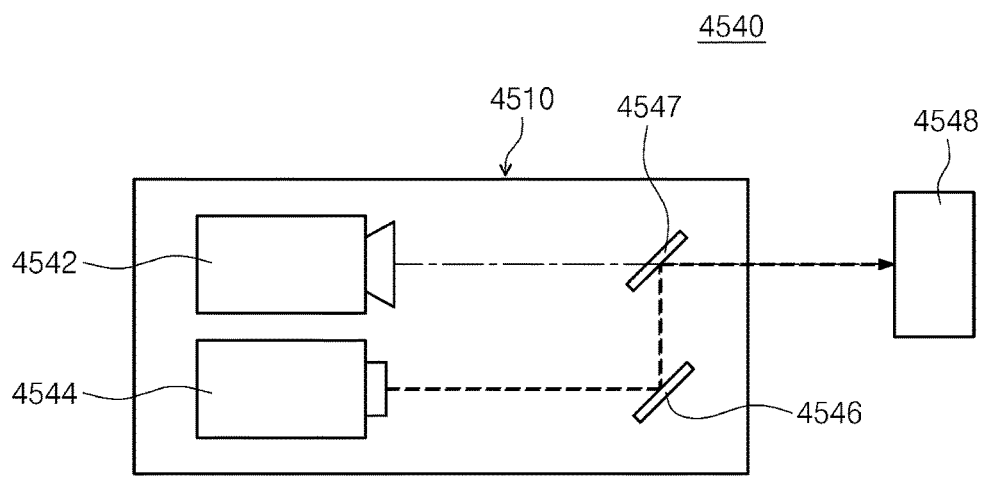
FIG. 7 schematically illustrates the irradiating module of FIG. 6 as viewed from above.

FIG. 6 schematically illustrates the irradiating module of FIG. 4 viewed from the front. FIG. 7 schematically illustrates the irradiating module of FIG. 6 as viewed from above. Hereinafter, an irradiating module according to an embodiment of the present disclosure will be described in detail with reference to FIG. 6 and FIG. 7.

The irradiating module 450 may irradiate the light with respect to the substrate M. For example, the irradiating module 450 may heat the substrate M. In addition, the irradiating module 450 may monitor a heat treatment performed on the substrate M. The irradiating module 450 may include a housing 4510, a moving unit 4520, a laser unit 4530, an imaging unit 4540, a purge gas supply unit 4550, a cover 4560, and a flow cover 4580.

The housing 4510 has an installation space therein. The laser unit 4530 and the imaging unit 4540 may be positioned in the installation space of the housing 4510. In an embodiment, a laser unit 4530, a camera unit 4542, and a lighting unit 4544 may be positioned in the installation space of the housing 4510. The housing 4510 protects the laser unit 4530 and the imaging unit 4540 from particles, a fume, or scattering droplets generated during the process.

The purge gas supply line 4552 to be described later may be disposed in the installation space of the housing 4510. A purge port 4512 may be formed on the bottom surface of the housing 4510. The purge port 4512 may allow the purge gas supplied from the purge gas supply unit 4550 to be described later to flow. The purge port 4512 may communicate with a flow space of the flow cover 4580 to be described later.

An opening may be formed under the housing 4510. An irradiation end 4535 to be described later may be inserted into the opening of the housing 4510. As the irradiation end 4535 is inserted into the opening of the housing 4510, an end of the irradiation end 4535 can be positioned to protrude from the bottom end of the housing 4510. For example, a portion of the barrel 4537 to be described later may protrude from the bottom end of the housing 4510.

The moving unit 4520 moves the housing 4510. The moving unit 4520 may move the irradiation end 4535 to be described later by moving the housing 4510. The moving unit 4520 may include a driver 4522, a shaft 4524, and a moving member 4526.

The driver 4522 may be a motor. The driver 4522 may be connected to the shaft 4524. The driver 4522 may move the shaft 4524 in the vertical direction. The driver 4522 may rotate the shaft 4524. In an embodiment, a plurality of drivers 4522 may be provided. One of the plurality of drivers 4522 may be provided as a rotating motor for rotating the shaft 4524, and the other of the plurality of drivers 4522 may be provided as a linear motor for moving the shaft 4524 in the vertical direction.

The shaft 4524 may be connected to the housing 4510. The shaft 4524 may be connected to the housing 4510 via a moving member 4526. As the shaft 4524 rotates, the housing 4510 may also rotate. Accordingly, the position of the irradiation end 4535 to be described later may also be changed. For example, the position of the irradiation end 4535 may be changed in the third direction Z. In addition, the position of the irradiation end 4535 may be changed with respect to the third direction Z as a rotation axis.

When viewed from above, a center of the irradiation end 4535 may move while drawing an arc toward a center of the shaft 4524. When viewed from above, the center of the irradiation end 4535 may be moved to pass through the center of the substrate M supported by the support unit 420. The irradiation end part 4535 may be moved between a process position of irradiating the laser light L to the substrate M by the moving unit 4520 and a standby position, which is a position of standing by without performing the heat treatment on the substrate M.

The moving member 4526 may be provided between the housing 4510 and the shaft 4524. The moving member 4526 may be an LM guide. The moving member 4526 may move the housing 4510 in a lateral direction. The moving member 4526 may move the housing 4510 in the first direction X and/or the second direction Y. The position of the irradiation end 4535 may be variously changed by the driver 4522 and the moving member 4526.

The laser unit 4530 may heat the substrate M. The laser unit 4530 may heat the substrate M supported by the support unit. The laser unit 4530 may heat a partial region of the substrate M. The laser unit 4530 may heat a specific region of the substrate M. The laser unit 4530 may heat the substrate M on which a liquid film is formed by supplying a chemical. The laser unit 4530 may heat a pattern formed on the substrate M. The laser unit 4530 may heat any one of the first pattern P1 and the second pattern P2. The laser unit 4530 may heat the second pattern P2 of the first pattern P1 and the second pattern P2. According to an embodiment, the laser unit 4530 may heat the second pattern P2 by irradiating the laser light L.

The laser unit 4530 may include a laser irradiation unit 4531, a beam expander 4532, a tilting member 4533, a bottom reflective member 4534 (i.e., a bottom reflector), and a irradiation end 4535 (i.e., a lens). The laser irradiation unit 4531 irradiates the laser light L. The laser irradiation unit 4531 may irradiate the laser light L having a straightness. The laser light L irradiated from the laser irradiation unit 4531 may be irradiated to the substrate M through the bottom reflective member 4534 and the irradiation end 4535 to be described later. In an embodiment, the laser light L irradiated from the laser irradiation unit 4531 may be irradiated with a second pattern P2 formed on the substrate M through the bottom reflective member 4534 and the irradiation end 4535 in order.

The beam expander 4532 may control characteristics of the laser light L irradiated by the laser irradiation unit 4531. The beam expander 4532 may adjust the shape of the laser light L irradiated from the laser irradiation unit 4531. In addition, the beam expander 4532 may adjust the profile of the laser light L irradiated from the laser irradiation unit 4531. For example, a diameter of the laser light L emitted from the laser irradiation unit 4531 may be changed in the beam expander 4532. The diameter of the laser light L emitted by the laser irradiation unit 4531 may be expanded or reduced in the beam expander 4532.

The tilting member 4533 may tilt an irradiation direction of the laser light L emitted by the laser irradiation unit 4531. The tilting member 4533 may rotate the laser irradiation unit 4531 based on an axis. The tilting member 4533 may rotate the laser irradiation unit 4531 to tilt the irradiation direction of the laser light L irradiated from the laser irradiation unit 4531. The tilting member 4533 may include a motor.

The bottom reflective member 4534 may change the irradiation direction of the laser light L irradiated from the laser irradiation unit 4531. For example, the bottom reflective member 4534 may change the irradiation direction of the laser light L irradiated in the horizontal direction to a vertical downward direction. For example, the bottom reflective member 4534 may change the irradiation direction of the laser light L to a direction toward the irradiation end 4535 to be described later. The laser light L refracted by the bottom reflective member 4534 may be transmitted to the substrate M to be treated or the monitoring target 491 to be described later through the irradiation end 4535 to be described later.

The bottom reflective member 4534 may be positioned to overlap a top reflective member 4548 (i.e., a top reflector) to be described later when viewed from above. The bottom reflective member 4534 may be disposed below the top reflective member 4548. The bottom reflective member 4534 may be tilted at the same angle as the top reflective member 4548.

The irradiation end 4535 may include a lens and a body tube. In an embodiment, the lens may be an objective lens. The body tube may be installed at the bottom end of the lens. The body tube may have a substantially cylindrical shape. The body tube may be inserted into an opening formed at a bottom end of the housing 4510. The end of the body tube may be positioned to protrude from a bottom end of the housing 4510.

The lens and the body tube may function as an irradiation end 4535 through which the laser light L is irradiated to the substrate M. The laser light L emitted by the laser unit 4530 may be emitted to the substrate M through the irradiation end 4535. An image capture of the camera unit 4542 may be provided through the irradiation end 4535. The light emitted by the lighting module 4544 may be provided through the irradiation end 4535.

The imaging unit 4540 may image the laser light L emitted by the laser unit 4530. The imaging unit 4540 may obtain an image, such as a video and/or a photograph, of a region in which the laser light L is irradiated from the laser module 4330. The imaging unit 4540 may monitor the laser light L irradiated from the laser irradiation unit 4531.

The imaging unit 4540 may monitor an information of the laser light L irradiated from the laser irradiation unit 4531. For example, the imaging unit 4540 may monitor a diameter information of the laser light L. In addition, the imaging unit 4540 may monitor the center information of the laser light L. In addition, the imaging unit 4540 may monitor a profile information of the laser light L. The imaging unit 4540 may include a camera unit 4542, a lighting unit 4544, and the top reflective member 4548.

The camera unit 4542 acquires an image of the laser light L irradiated from the laser irradiation unit 4531. For example, the camera unit 4542 may obtain an image including a point at which the laser light L irradiated by the laser irradiation unit 4531 is irradiated. In addition, the camera unit 4542 acquires an image of the substrate M supported by the support unit 420. In addition, the camera unit 4542 may obtain an image of the monitoring target 491 of the detection unit 490, which will be described later.

The camera unit 4542 may be a camera. A direction in which the camera unit 4542 images to acquire an image may be directed toward a top reflective member 4548 to be described later. The camera unit 4542 may transmit an acquired image to the controller 30. The camera unit 4542 may acquire an image in which the laser light L irradiated by the laser irradiation unit 4531 is displayed on the monitoring target 491, and transmit the acquired image to the controller 30.

The lighting unit 4544 may provide the light so that the camera unit 4542 may easily acquire an image. The lighting unit 4544 may include a lighting member 4545, a first reflective plate 4546, and a second reflective plate 4547. The lighting member 4545 irradiates the light. The lighting member 4545 provides the light. The light provided by the lighting member 4545 may be sequentially reflected along the first reflective plate 4546 and the second reflective plate 4547. The light provided by the lighting member 4545 may be reflected from the second reflective plate 4547 and irradiated in a direction toward the top reflective member 4548 to be described later.

The top reflective member 4548 may change the imaging direction of the camera unit 4542. For example, the top reflective member 4548 may change the imaging direction of the camera unit 4542 which is the horizontal direction to the vertical downward direction. For example, the top reflective member 4548 may change the imaging direction of the camera unit 4542 to face the irradiation end 4535. The top reflective member 4548 may change the irradiation direction of the light of the lighting member 4545, which is sequentially transmitted through the first reflective plate 4546 and the second reflective plate 4547, from the horizontal direction to the vertical downward direction. For example, the top reflective member 4548 may change the irradiation direction of light of the lighting unit 4544 to face the irradiation end 4535.

The top reflective member 4548 and the bottom reflective member 4534 may be positioned to overlap when viewed from above. The top reflective member 4548 may be disposed above the bottom reflective member 4534. The top reflective member 4548 and the bottom reflective member 4534 may be tilted at the same angle. The top reflection member 4548 and the bottom reflective member 4534 may have a coaxial axis if an irradiation direction of the laser light L irradiated from the laser irradiation unit 4531, the imaging direction for acquiring an image by the camera unit 4542, and the irradiation direction of light provided by the lighting unit 4544 are seen from above.

The purge gas supply unit 4550 may be installed inside the housing 4510. The purge gas supply unit 4550 may be disposed in an installation space of the housing 4510. The purge gas supply unit 4550 may include a purge gas supply source (not shown) and a purge gas supply line 4552.

According to an embodiment, the purge gas supply source (not shown) may be positioned in an installation space of the housing 4510. However, the present disclosure is not limited thereto, and the purge gas supply source (not shown) may be positioned outside the housing 4510. The purge gas supply source (not shown) functions as a source for storing or/and supplying purge gas. An end of the purge gas supply line 4552 may be connected to the purge gas supply source (not shown), and the other end of the purge gas supply line 4552 may be connected to a purge port 4512 formed on the bottom surface of the housing 4510. The purge gas flowing through the purge supply line 4552 may flow into the flow space of the flow cover 4580 to be described later through the purge port 4512.

Figure 8:
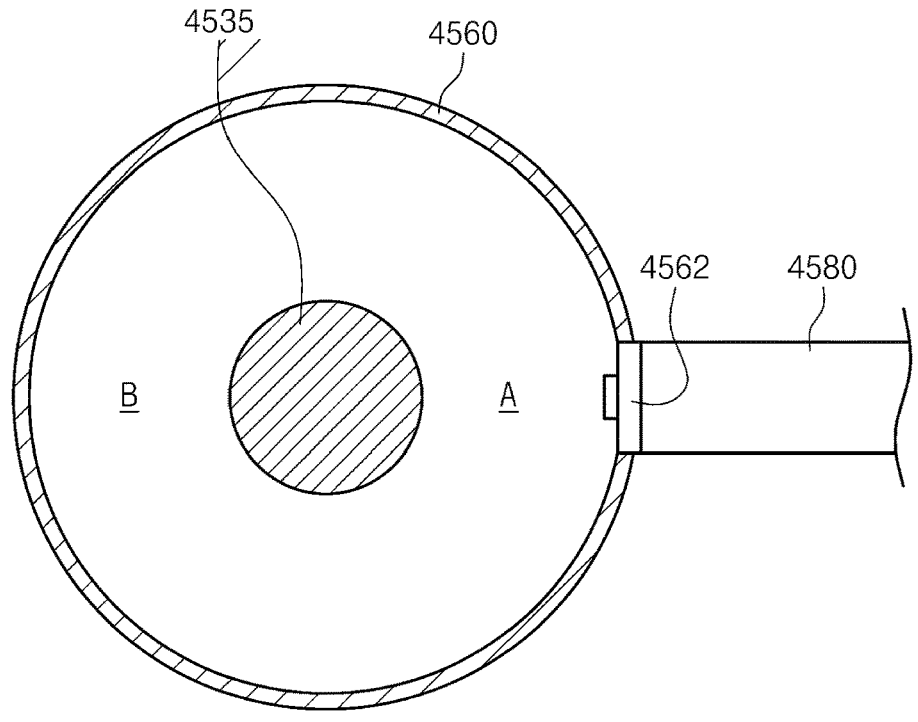
FIG. 8 schematically illustrates a cover and a flow cover viewed from above according to an embodiment of FIG. 6.
Figure 9:
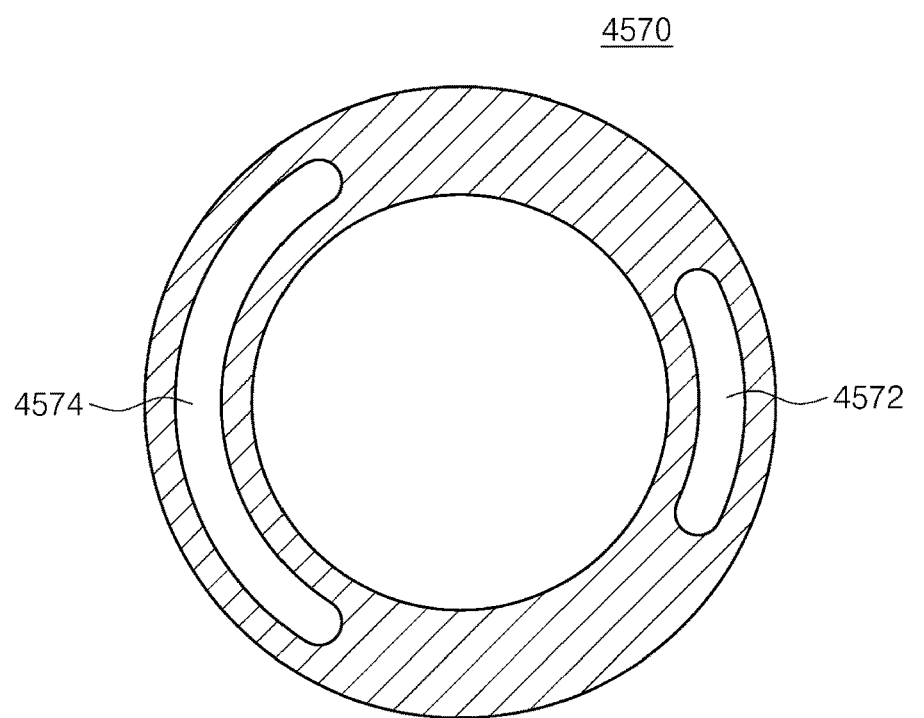
FIG. 9 schematically illustrates a dividing member according to an embodiment of FIG. 6 as viewed from above.

FIG. 8 schematically illustrates a cover and a flow cover viewed from above according to an embodiment of FIG. 6. FIG. 9 schematically illustrates a dividing member according to an embodiment of FIG. 6 as viewed from above. Hereinafter, a cover and a flow cover according to an embodiment of the present disclosure will be described in detail with reference to FIG. 6 to FIG. 9.

The cover 4560 is positioned at a bottom end of the housing 4510. The cover 4560 can be formed to downwardly protrude from the bottom end of the housing 4510 at a position corresponding to the irradiation end 4535 when viewed from above. The cover 4560 has an inner space. An end of the irradiation end 4535 may be positioned in the inner space of the cover 4560. For example, a portion of the barrel 4537 may be positioned in the inner space of the cover 4560. The cover 4560 may have a substantially cylindrical shape.

The cover 4560 may be integrally formed with the housing 4510 and the flow cover 4580 to be described later. However, inner space is not limited to this, and the housing 4510, the cover 4560, and the flow cover 4580 are respectively formed and can be combined by a physical or/and chemical method. Optionally, the cover 4560 and the flow cover 4580 may be integrally formed, and the housing 4510 may be physically or/and chemically coupled to the cover 4560 and the flow cover 4580.

An opening is formed at a bottom end of the cover 4560. The opening formed in the cover 4560 is formed at a position overlapping the laser light L irradiated from the irradiation end 4535 when viewed from above. For example, the opening is formed at a position overlapping the laser light L irradiated through the lens member 4535 when viewed from above. In addition, the opening is formed in a size that does not interfere with the laser light L irradiated from the irradiation end 4535, the image capture of the camera unit 4542, and the light of the lighting unit 4544.

A supply port 4562 may be formed on a side surface of the cover 4560. In an embodiment, as shown in FIG. 8, the supply port 4562 may be formed on a side of the cover 4560 corresponding to the central axis of the irradiation end 4535 based on the central axis of the irradiation end 4535 when viewed from above. The supply port 4562 may communicate with a flow space formed inside the flow cover 4580 to be described later. Accordingly, the purge gas supplied from the purge gas supply unit 4550 may be sequentially supplied to the purge port 4512, the flow space of the flow cover 4580, and the inner space of the cover 4560 through the supply port 4562.

The dividing member 4570 may be installed in an inner space of the cover 4560. The dividing member 4570 may divide the inner space of the cover 4560 into a top space and a bottom space. The top space of the dividing member 4570 may function as a buffer space. The buffer space may be provided as a space in which the purge gas supplied through the supply port 4562 temporarily remains.

Hereinafter, for convenience of explanation, a region adjacent a part at which the supply port 4562 is installed in the inner space of the cover 4560 is defined as a first region A, and a region facing the first region A in the inner space of the cover 4560 is defined as a second region B.

As shown in FIG. 9, the distribution unit 4590 may be formed in a ring shape. An outer circumferential surface of the dividing member 4570 may be in contact with the inner surface of the cover 4560. An inner circumferential surface of the dividing member 4570 may be in contact with an outer surface of the irradiation end 4535.

A first slit 4572 and a second slit 4574 may be formed in the dividing member 4570. The first slit 4572 may be formed in an area corresponding to the first region A. The first slit 4572 may be provided as a slit penetrating from a top end to a bottom end of the dividing member 4570. The first slit 4572 may be formed along a circumferential direction of the dividing member 4570. The first slit 4572 may have a first opening area D1.

The second slit 4574 may be formed in a region corresponding to the second region B. The second slit 4574 may be provided as a slit penetrating the vertical direction of the dividing member 4570. The second slit 4574 may be formed along the circumferential direction of the dividing member 4570. The second slit 4574 may have a second opening area D2. The second opening area D2 is provided relatively larger than the first opening area D1.

The dividing member 4570 may uniformly discharge the purge gas supplied to the inner space of the cover 4560 from the inner space. The purge gas supplied to the buffer space of the cover 4560 temporarily remains in the buffer space. The purge gas flowing in the buffer space passes through the first slit 4572 and the second slit 4574 formed in the dividing member 4570. By forming the opening areas of the first slit 4572 and the second slit 4574 differently, an average flow rate of the purge gas passing through the first slit 4572 is smaller than an average flow rate of the purge gas passing through the second slit 4574. Accordingly, the purge gas flowing in a bottom space of the inner space of the cover 4560 may be uniformly distributed. The purge gas having a uniform flow in the bottom space is uniformly emitted to the outside of the cover 4560 through an opening formed at a bottom end of the cover 4560.

The flow cover 4580 may connect the cover 4560 and the housing 4510. The flow cover 4580 may be coupled to a side surface of the cover 4560. The flow cover 4580 may be coupled to extend in a lateral direction from the cover 4560. The flow cover 4580 is positioned at a bottom end of the housing 4510. The flow cover 4580 may connect the purge port 4512 and the supply port 4562, respectively. The flow cover 4580 has a flow space through which purge gas flows. The flow cover 4580 may have the flow space through which the purge gas supplied from the purge port 4512 flows. Accordingly, the flow space of the flow cover 4580 may communicate with the purge port 4512 and the supply port 4562.

The purge gas supplied from the gas supply line 4552 connected to the purge port 4512 flows in the flow space of the flow cover 4580. The purge gas supplied from the purge port 4512 is supplied to the supply port 4562 through the flow space of the flow cover 4580. The purge gas supplied to the supply port 4562 is supplied to the inner space of the cover 4560. In an embodiment, the purge gas supplied to the supply port 4562 flows into the buffer space of the cover 4560. The purge gas supplied to the buffer space passes through the first slit 4572 and the second slit 4574 formed in the dividing member 4570 and is uniformly discharged to the opening formed at the bottom end of the cover 4560.

In general, if a liquid treatment process is performed on the substrate M or a heat treatment process is performed on the substrate M, a distance between the substrate M and the substrate treating apparatus 1 is positioned very close. Accordingly, the treating liquid which is splattered back from the substrate M during the process may be attached to the irradiating module 450. In addition, particles such as a fume generated from the substrate M during the process may be attached to the irradiating module 450. In particular, if droplets or/and particles are attached to the irradiation end 4535 to which various kinds of light are irradiated, the path or/and profile of the laser light L irradiated from the irradiating module 450 are changed. It makes it difficult to perform a precise etching process on the substrate M.

Figure 10:
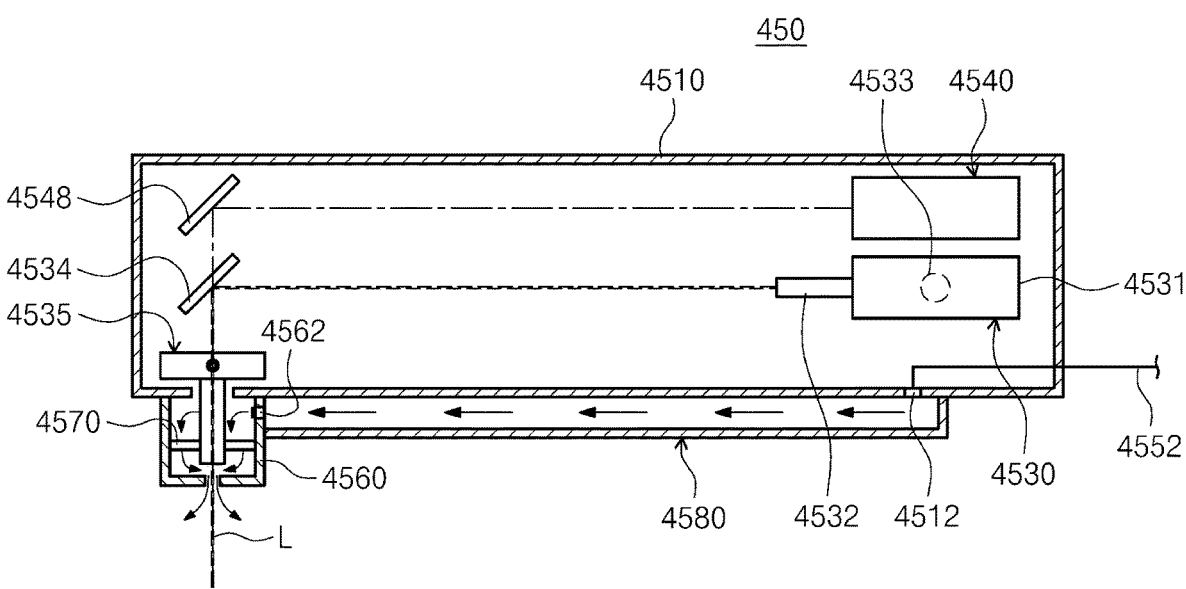
FIG. 10 schematically illustrates a state in which a purge gas flows inside the irradiating module of FIG. 6.

FIG. 10 schematically illustrates a state in which the purge gas flows inside the irradiating module of FIG. 6. Referring to FIG. 8 and FIG. 10, the irradiating module 450 according to an embodiment of the present disclosure may provide a laser unit 4530 irradiating a laser light L, a camera unit 4542 for imaging an image, and a lighting unit 4544 provided to surround the housing 4510, thereby firstly protecting the laser unit 452, the camera unit 4542 for imaging an image, and the lighting unit 454 from an ink drop and/or particle generated during a process.

In addition, according to an embodiment of the present disclosure, the irradiation end 4535 in which the laser light L, the image capture, and the light are irradiated may be protected by the cover 4560. An opening is formed at the bottom end of the cover 4560 so that laser light L irradiated from the irradiation end 4535, the image capture, and the light irradiation are not interfered with, but the ink drop and/or the particle etc. which may be introduced into the opening may be supplied to the inner space of the cover 4560 so the irradiating module 450 may be secondly protected.

In addition, most of the purge gas supplied to the first region A in the inner space of the cover 4560 flows out of the opening along the sidewall of the opening adjacent to the first region A. Accordingly, the amount of purge gas flowing to the second region B in the inner space of the cover 4560 is relatively smaller than the amount of purge gas flowing in the area adjacent to the first region A. Accordingly, the supply of purge gas in the second region B of the inner space of the cover 4560 is not smoothly performed. Accordingly, particles and/or droplets generated during the process may be introduced from an opening adjacent to the second region B.

According to an embodiment of the present disclosure, opening areas of the first slit 4572 and the second slit 4574 installed in the inner space of the cover 4560 may be formed differently, so the particle and/or the ink drop generated from the process may be uniformly supplied to the second region B, which is a region facing the supply port 4562 to which the purge gas is supplied, as well as the first region A.

Figure 11:
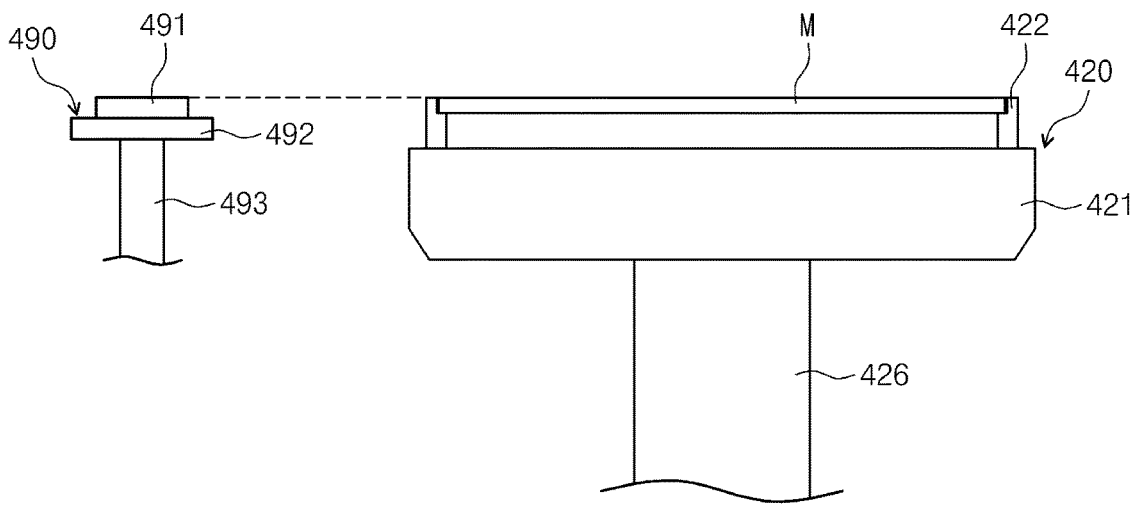
FIG. 11 schematically illustrates an embodiment of the detection unit and the support unit of FIG. 4.
Figure 12:
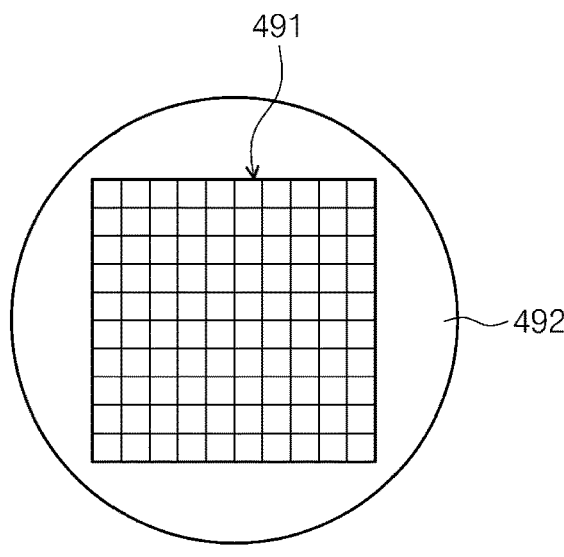
FIG. 12 is a view of the detection unit of FIG. 11 as viewed from above.

FIG. 11 schematically illustrates an embodiment of the detection unit and the support unit of FIG. 4. FIG. 12 is a view of the detection unit of FIG. 11 as viewed from above. Referring to FIG. 11 and FIG. 12, the detection unit 490 can check whether an error occurs between the irradiation position of the laser light L and a preset target position TP. For example, the detection unit 490 may be provided in an inner space of the housing 410. In addition, the detection unit 490 may be installed in a region area below the irradiation end 4535 if the irradiation end 4535 is in the aforementioned standby position. The detection unit 490 may include a monitoring target 491, a plate 492, and a support frame 493. The plate 492 and the support frame 493 may be provided as a standby port providing a space in which the irradiation end 4535 stands by. The standby port is positioned at a standby position at which the irradiation end 4535 stands by. Accordingly, the plate 492 and the support frame 493 may be positioned at the standby position when viewed from above.

The monitoring target 491 may be referred to as a global coordinate system. A preset target position TP may be displayed on the monitoring target 491. In addition, the monitoring target 491 may include a scale to confirm an error between the target position TP and the irradiation position at which the laser light L is irradiated. The monitoring target 491 may have an origin corresponding to the center of the irradiation end 4535 positioned above the standby port. The monitoring target 491 may have an origin corresponding to the center of the laser light L irradiated from the irradiation end 4535 positioned above the standby port.

The monitoring target 491 may be installed on the plate 492. The plate 492 may be supported by the support frame 493. A height of the monitoring target 491 determined by the plate 492 and the support frame 493 may be the same as that of the substrate M supported by the support unit 420. For example, a height from the bottom surface of the housing 410 to the top surface of the monitoring target 491 may be the same as a height from the bottom surface of the housing 410 to the top surface of the substrate M supported by the support unit 420. This is to match a height of the laser irradiation end 4535 and a height of the irradiation end 4535 when heating the substrate M when checking an error using the detection unit 490.

If the irradiation direction of the laser light L irradiated from the irradiation end 4535 is slightly distorted with respect to the third direction Z, the monitoring target 491 may be provided at the same height as the substrate M supported by the support unit 420 because the irradiation position of the laser light L may differ according to the height of the irradiation end.

The substrate treating apparatus 1 according to an embodiment described below is provided mostly similar to the configuration of the substrate treating apparatus 1 according to the example described above, except for the case where additional description is provided.

Figure 13:
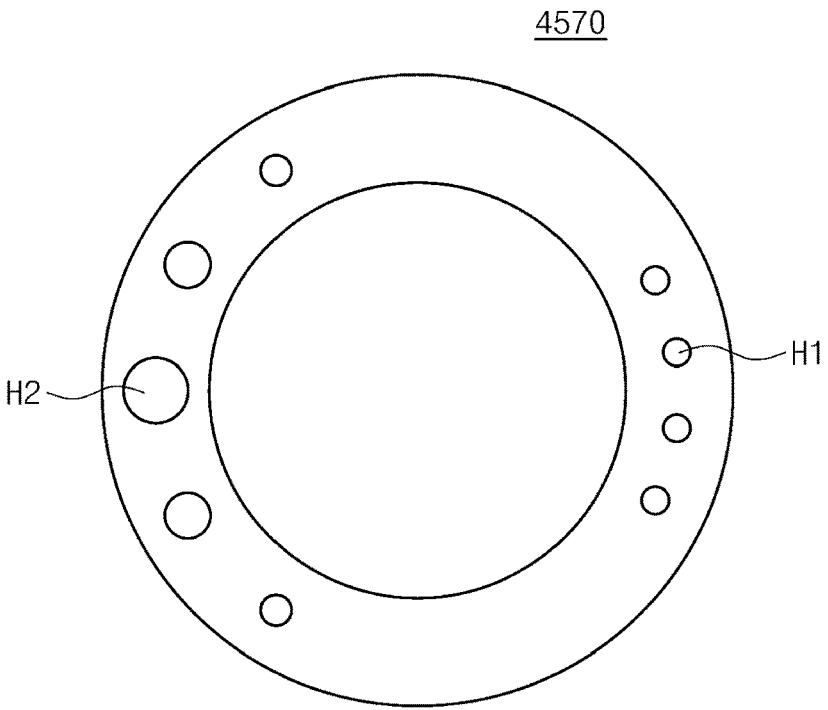
FIG. 13 schematically illustrates a top view of another embodiment of the dividing member of FIG. 6.

FIG. 13 schematically illustrates a top view of another embodiment of the dividing member of FIG. 6. Referring to FIG. 13, the dividing member 4570 may be installed in an inner space of the cover 4560. The dividing member 4570 may distribute the purge gas supplied to the inner space. The dividing member 4570 may distribute purge gas supplied in a direction of the inner space in the other direction opposite to the direction of the purge space. Hereinafter, for convenience of explanation, a region adjacent to the point at which the supply port 4562 is installed in the inner space of the cover 4560 is defined as a first region A, and a region opposite to the first region A in the inner space of the cover 4560 is defined as a second region B.

The dividing member 4570 may be formed in a ring shape. An outer circumferential surface of the dividing member 4570 may be in contact with the inner surface of the cover 4560. An inner circumferential surface of the dividing member 4570 may be in contact with an outer surface of the irradiation end 4535.

As shown in FIG. 13, a first hole H1 and a second hole H2 may be formed in the dividing member 4570. A plurality of first holes H1 and a plurality of second holes H2 may be provided. The plurality of first holes H1 may be formed in a region corresponding to the first region A. The first holes H1 are provided as through holes penetrating from the top end to the bottom end of the dividing member 4570. The first holes H1 may be spaced apart from each other along the circumferential direction of the dividing member 4570. The first holes H1 may have different diameters. For example, as shown in FIG. 13, the first holes H1 disposed at positions close to the first region A1 among the first holes H1 may have smaller diameters than the first holes H1 disposed at positions far from the first region A1.

The second holes H2 are provided as holes penetrating from the top end to the bottom end of the dividing member 4570. The second holes H2 may be spaced apart from each other along the circumferential direction of the dividing member 4570. The second holes H2 may have different diameters. For example, as shown in FIG. 13, the second holes H2 disposed in a region adjacent to the supply port 4517 among the second holes H2 may have a smaller diameter than the second holes H2 disposed at a position relatively far from the supply port 4562. An average diameter of the second holes H2 may be provided smaller than an average diameter of the first holes H1.

According to an embodiment of the present disclosure, average diameters of the first holes H1 and the second holes H2 installed at the purge space are formed differently, so the particle and/or the ink drop generated from the process may be uniformly supplied to the second region B, which is a region facing the supply port 4562 to which the purge gas is supplied, as well as the first region A.

Unlike the above-described embodiment, the first holes H1 may have the same diameter. In addition, the second holes H2 may have the same diameter. The diameter of the first holes H1 may be smaller than the diameter of the second holes H2.

Figure 14:
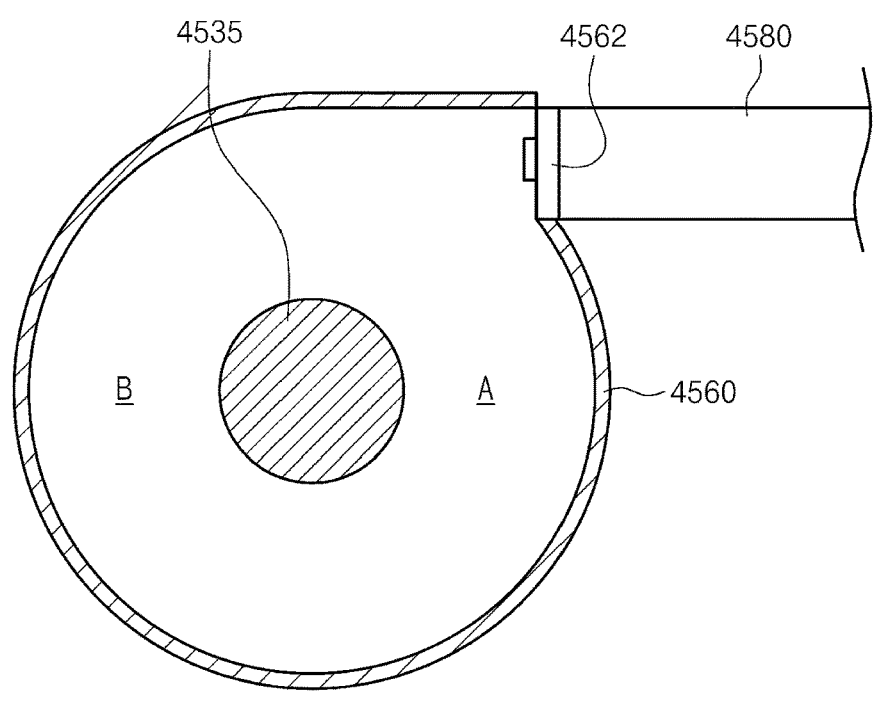
FIG. 14 schematically illustrates a top view of another embodiment of the cover and the flow cover of FIG. 6.
Figure 15:
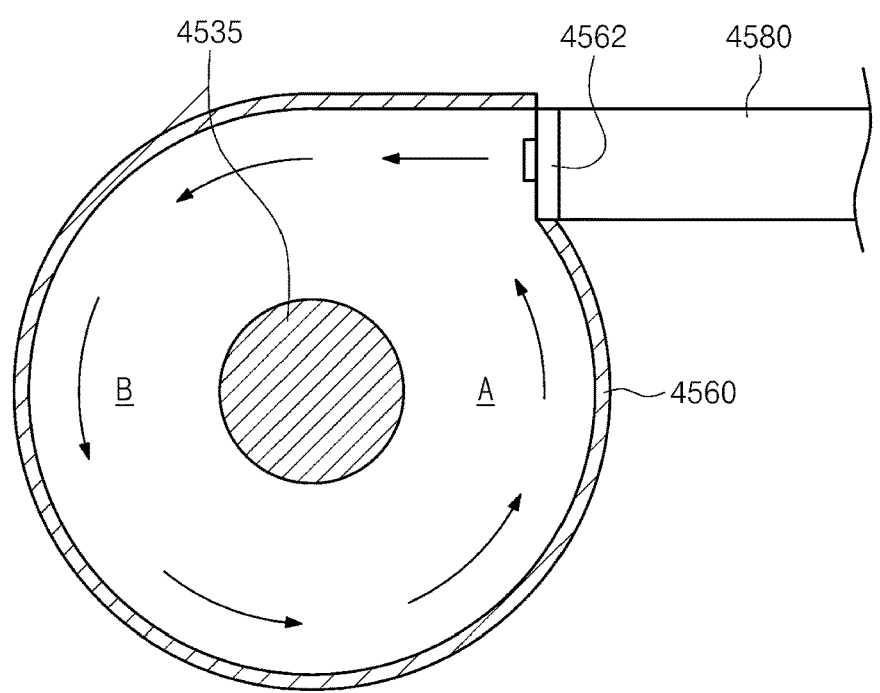
FIG. 15 schematically illustrates a state in which a purge gas flows in the purge space of FIG. 14.

FIG. 14 schematically illustrates a top view of another embodiment of the cover and the flow cover of FIG. 6. FIG. 15 schematically illustrates a state in which a purge gas flows in the purge space of FIG. 14. Referring to FIG. 14 and FIG. 15, a supply port 4562 may be formed on a side surface of the cover 4560. In an embodiment, as shown in FIG. 14, the supply port 4562 may be installed at a position spaced apart from the central axis of the irradiation end 4535 based on the central axis of the irradiation end 4535 when viewed from above. The supply port 4562 may communicate with a flow space inside the flow cover 4580. The purge gas flowing through the flow space of the flow cover 4580 through the supply port 4562 may be supplied to the inner space of the cover 4560. Since the supply port 4562 is installed to be spaced apart from the central axis of the irradiation end 4535, the purge gas supplied to the inner space of the cover 4560 may rotate and flow in the inner space as shown in FIG. 15.

According to an embodiment of the present disclosure, even if the supply port 4562 for supplying the purge gas is installed on a side of the cover 4560, it flows by rotating in the inner space of the cover 4560 so that it can uniformly flow in a spiral direction in the inner space of the cover 4560. Accordingly, it is possible to efficiently prevent particles or/and droplets generated during the process from flowing into the inner space of the cover 4560.

In addition, since the purge gas rotates and flows in the inner space of the cover 4560, the purge gas may flow toward a side of the opening formed at the bottom of the cover 4560. Accordingly, the irradiating module 450 may be efficiently protected without causing a vibration in the liquid film previously formed on the substrate M or damaging the previously formed liquid film in the process of treating the substrate M.

Figure 16:
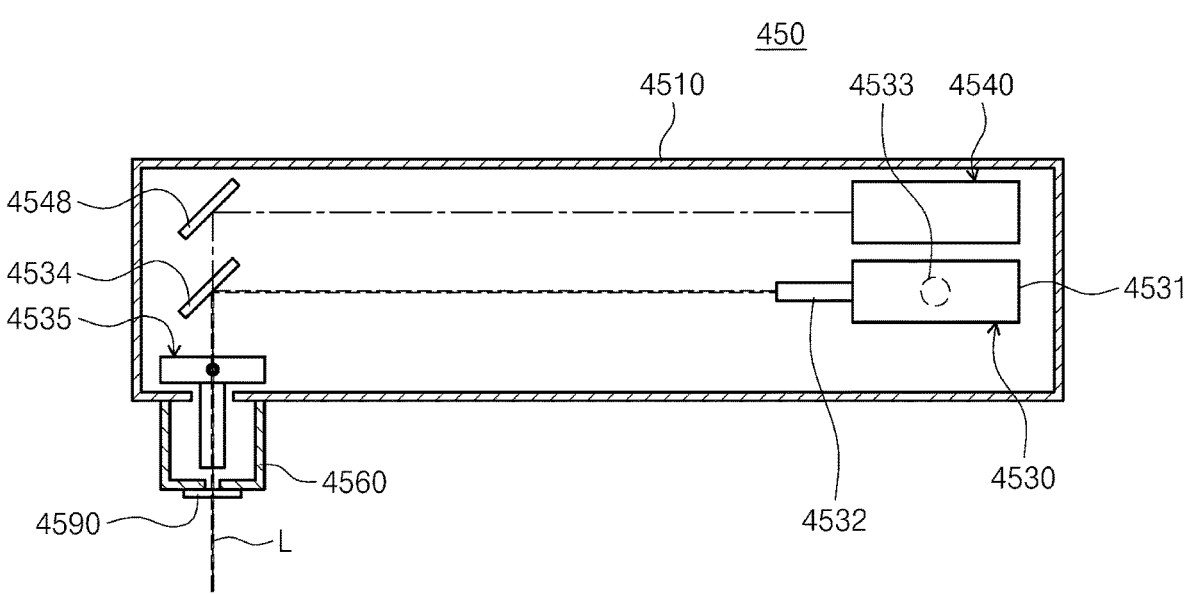
FIG. 16 schematically illustrates a front view of another embodiment of the irradiating module of FIG. 6.

FIG. 16 schematically illustrates a front view of another embodiment of the irradiating module of FIG. 6. Referring to FIG. 16, a cover plate 4590 may be installed on the cover 4560. The cover plate 4590 may be made of a light-transmitting material. In addition, the cover plate 4590 may be formed of a transparent material. For example, the cover plate 4590 may cover an opening formed at the bottom end of the cover 4560. The cover plate 4590 may seal an opening formed in the cover 4560. The cover plate 4590 may seal the inner space of the irradiating module 450 by sealing the opening. Accordingly, it is possible to efficiently prevent a damage to the laser unit 4530, camera unit 4542, and lighting unit 4544 installed inside the housing 4510 from particles or/and droplets without affecting laser light L, image capture, and light irradiation emitted by the irradiating module 450.

In embodiments of the present disclosure described above, the flow cover 4580 is provided, and the purge gas is supplied to the inner space of the cover 4560 through the flow space in the flow cover 4580, but the present disclosure is not limited thereto. For example, the flow cover 4580 may not be provided, and the purge port 4512 may not be formed on the bottom surface of the housing 4510. For example, the purge gas supply unit 4550 may directly supply the 4 purge gas to the inner space of the cover 4560.

In the above-described embodiment of the present disclosure, an etching rate of the second pattern P2 has been improved in the substrate M having a first pattern P1, which is a monitoring pattern for monitoring an exposing pattern, and a second pattern P2, which is a condition setting pattern for treating the substrate. However, unlike this, functions of the first pattern P1 and the second pattern P2 may be different from those of the embodiment of the present disclosure described above. In addition, according to the embodiment of inner space, only one of the first pattern P1 and the second pattern P2 is provided, and the etching rate of one of the first pattern P1 and the second pattern P2 can be improved. In addition, according to the embodiment of the present disclosure, the same can be applied when improving the etching rate of a specific area on the substrate such as a wafer or a glass other than a photo mask.

The effects of the inventive concept are not limited to the above-mentioned effects, and the unmentioned effects can be clearly understood by those skilled in the art to which the inventive concept pertains from the specification and the accompanying drawings.

Although the embodiment of the present disclosure has been illustrated and described until now, the present disclosure is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
   a support unit configured to support and rotate a substrate at a treating space;
   a liquid supply unit configured to supply a liquid to the substrate supported by the support unit;
   a housing having an installation space;
   a laser unit configured to include
   a laser in the installation space which emits a laser light in a first direction,
   a reflector directing the laser light in a second direction, and
   an irradiation end extending in the second direction through a bottom surface of the housing and configured to emit the laser light toward the substrate supported by the support unit; and
   a cover having an inner space into which the irradiation end protrudes from the housing,
   wherein the cover is connected to the bottom surface of the housing,
   wherein the irradiation end is disposed in a space defined by the bottom surface of the housing and the cover, and
   wherein the cover includes an opening at a bottom of the cover and the laser light emitted from the irradiation end passes through the opening of the cover.

2. The substrate treating apparatus of claim 1 further comprising:
   a purge gas supply unit for supplying a purge gas to the inner space.

3. The substrate treating apparatus of claim 2, further comprising:
   a dividing member having a ring shape surrounding a portion of the irradiation end and dividing the inner space into a buffer space and a bottom space,
   wherein the buffer space is a portion of the inner space above the dividing member and the bottom space is a portion of the inner space below the dividing member.

4. The substrate treating apparatus of claim 3,
   wherein the dividing member comprises:
   a first slit formed at a region which is adjacent to a part at which the purge gas is supplied to in the inner space among the inner space, and which has a first opening area; and
   a second slit formed at a region facing the part at which the purge gas is supplied to in the inner space among the inner space, and which has a second opening area, and
   wherein the first opening area is smaller than the second opening area.

5. The substrate treating apparatus of claim 3,
   wherein the dividing member comprises:
   a plurality of first holes formed at a region adjacent to a portion at which the purge gas is supplied to the inner space among the inner space; and
   a plurality of second holes formed at a region facing the portion at which the purge gas is supplied to the inner space among the inner space, and
   wherein an average diameter of the plurality of first holes is smaller than an average diameter of the plurality of second holes.

6. The substrate treating apparatus of claim 2, further comprising:
   a purge port connected to the purge gas supply unit at an end of the housing;
   a supply port connected to a side of the cover and supplying the purge gas to the inner space; and
   a flow cover connected to the side of the cover, wherein a space between the flow cover and the bottom surface of the housing is a flow passage between the purge port and the supply port.

7. The substrate treating apparatus of claim 6,
   wherein the supply port is at a position spaced apart from a central axis of the irradiation end and connects the flow passage to the inner space.

8. The substrate treating apparatus of claim 7, further comprising:
   a cover plate provided to cover the opening and including a transparent material through which the laser light passes.

9. The substrate treating apparatus of claim 1, further comprising:
   an imaging unit for imaging the laser light irradiated from the laser unit,
   wherein the imaging unit is positioned at the installation space.

10. The substrate treating apparatus of claim 9,
    wherein the laser unit further comprises:
    a beam expander for controlling a characteristic of the laser light irradiated by the laser unit,
    wherein the imaging unit comprises:
    a camera unit configured to image an image of the laser light irradiated from the laser unit and/or the substrate; and
    a lighting unit configured to provide a light for acquiring the image of the camera unit, and
    wherein an irradiation direction of the laser light, an imaging direction of the camera unit, and an irradiation direction of light are aligned in the second direction.

11. An irradiating module for irradiating a light to a substrate comprising:
    a housing having an installation space;
    a laser unit configured to include a laser irradiation unit positioned in the installation space which irradiates a laser light, and an irradiation end having an end positioned to protrude from the housing and which irradiates the laser light irradiated from the laser irradiation unit to the substrate; and
    a cover having an inner space and positioned so an end of the irradiation end protruding from the housing is positioned in the inner space,
    wherein the cover is connected to a bottom surface of the housing,
    wherein the irradiation end is disposed in a space defined by the bottom surface of the housing and the cover, and
    wherein an opening is formed at a bottom end of the cover to overlap the laser light irradiated from the irradiation end when seen from above.

12. The irradiating module of claim 11, further comprising a purge gas supply unit for supplying a purge gas to the inner space.

13. The irradiating module of claim 12,
    wherein a dividing member in a ring shape is installed at the inner space of the cover to divide the inner space into a buffer space which is above and a bottom space.

14. The irradiating module of claim 13,
    wherein the dividing member comprises:

a first slit formed at a region which is adjacent to a part at which the purge gas is supplied to in the inner space among the inner space, and which has a first opening area; and a second slit formed at a region facing the part at which the purge gas is supplied to in the inner space among the inner space, and which has a second opening area, and wherein the first opening area is smaller than the second opening area.

15. The irradiating module of claim 12, further comprising:

a purge port formed and connected to the purge gas supply unit at an end of the housing;

a supply port installed at a side of the cover which is spaced apart from a central axis of the irradiation end when seen from the front and supplying the purge gas to the inner space; and a flow cover combined to the side of the cover to connect the purge port and the supply port and having flow space for flowing the purge gas within.

16. The irradiating module of claim 11, further comprising a cover plate provided to cover the opening and which is provided as a material which passes the laser light through.

17. A substrate treating apparatus for treating a mask having a plurality of cells comprising:

a support unit configured to support and rotate the mask on which a first pattern is formed within the plurality of cells and a second pattern is formed outside a region at which the plurality of cells are formed;

a liquid supply unit configured to supply a liquid to the mask supported at the support unit;

a housing having an installation space;

a laser unit configured to include a laser irradiation unit positioned in the installation space which irradiates a laser light, and an irradiation end having an end positioned to protrude from the housing and which irradiates the laser light irradiated from the laser irradiation unit to the second pattern among the first pattern and the second pattern; and a cover having an inner space and positioned so an end of the irradiation end protruding from the housing is positioned in the inner space, wherein the cover is connected to a bottom surface of the housing, wherein the irradiation end is disposed in a space defined by the bottom surface of the housing and the cover, and wherein an opening is formed at a bottom end of the cover to overlap a laser light irradiated from the irradiation end when seen from the above.

18. The substrate treating apparatus of claim 17, further comprising a purge gas supply unit for supplying a purge gas to the inner space.

19. The substrate treating apparatus of claim 18, wherein a dividing member in a ring shape is installed at the inner space of the cover to divide the inner space into a buffer space which is above and a bottom space, wherein the dividing member comprises:

a first slit formed at a region which is adjacent to a part at which the purge gas is supplied to in the inner space among the inner space, and which has a first opening area; and a second slit formed at a region facing the part at which the purge gas is supplied to in the inner space among the inner space, and which has a second opening area, and wherein the first opening area is smaller than the second opening area.

20. The substrate treating apparatus of claim 18, further comprising:

a purge port is-formed and connected to the purge gas supply unit at an end of the housing;

a supply port installed at a side of the cover which is spaced apart from a central axis of the irradiation end when seen from the front, and which supplies the purge gas to the inner space; and a flow cover combined to the side of the cover to connect the purge port and the supply port, which has a flow space for flowing the purge gas within.

* * * * *